US010877070B2

(12) United States Patent
Frankel et al.

(10) Patent No.: US 10,877,070 B2
(45) Date of Patent: Dec. 29, 2020

(54) PROBES WITH FIDUCIAL TARGETS, PROBE SYSTEMS INCLUDING THE SAME, AND ASSOCIATED METHODS

(71) Applicant: FormFactor Beaverton, Inc., Beaverton, OR (US)

(72) Inventors: Joseph George Frankel, Beaverton, OR (US); Koby L. Duckworth, Newberg, OR (US); Kazuki Negishi, Hillsboro, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 16 days.

(21) Appl. No.: 16/249,044

(22) Filed: Jan. 16, 2019

(65) Prior Publication Data

US 2019/0227102 A1 Jul. 25, 2019

Related U.S. Application Data

(60) Provisional application No. 62/619,282, filed on Jan. 19, 2018.

(51) Int. Cl.
*G01R 1/08* (2006.01)
*G01R 1/067* (2006.01)

(52) U.S. Cl.
CPC ........... *G01R 1/08* (2013.01); *G01R 1/06727* (2013.01); *H01L 2224/81121* (2013.01)

(58) Field of Classification Search
CPC ................. G01R 1/08; G01R 1/06727; H01L 2223/54426; H01L 2224/81121
See application file for complete search history.

(56) References Cited

U.S. PATENT DOCUMENTS

| | | |
|---|---|---|
| 4,115,736 A | 9/1978 | Tracy |
| 6,710,798 B1 | 3/2004 | Hershel et al. |
| 6,924,653 B2 | 8/2005 | Schaeffer et al. |
| 6,933,738 B2 | 8/2005 | Martin et al. |
| 7,348,786 B2 | 3/2008 | Thacker et al. |
| 7,355,422 B2 | 4/2008 | Walker |
| 7,459,923 B2 | 12/2008 | Caldwell et al. |
| 7,538,564 B2 | 5/2009 | Ehrmann et al. |
| 7,634,128 B2 | 12/2009 | Snow et al. |
| 8,531,202 B2 | 9/2013 | Mok et al. |
| 9,804,196 B2 | 10/2017 | Bolt et al. |

(Continued)

FOREIGN PATENT DOCUMENTS

JP 2004101308 A 4/2004

OTHER PUBLICATIONS

English-language machine translation of JP 2004101308A, Apr. 2, 2004.
English-language abstract of JP 2004101308A, Apr. 2, 2004.

*Primary Examiner* — Huy Q Phan
*Assistant Examiner* — Dustin R Dickinson
(74) *Attorney, Agent, or Firm* — Dascenzo Gates Intellectual Property Law, P.C.

(57) ABSTRACT

Probes with fiducial targets, probe systems including the same, and associated methods. The probes include a probe body, a probe beam, a probe tip configured to contact a device under test (DUT), and a fiducial target affixed to the probe beam. The fiducial target is configured to be visible to an optical system to determine a position of the probe tip relative to the DUT. The methods include methods of utilizing and/or manufacturing the probes.

30 Claims, 5 Drawing Sheets

(56) References Cited

U.S. PATENT DOCUMENTS

| | | | |
|---|---|---|---|
| 2002/0156363 A1* | 10/2002 | Hunter | G06T 3/0068 |
| | | | 600/410 |
| 2003/0174401 A1 | 9/2003 | Brunner et al. | |
| 2007/0132465 A1 | 6/2007 | Kreissig et al. | |
| 2008/0030214 A1 | 2/2008 | Nguyen et al. | |
| 2009/0065583 A1* | 3/2009 | McGrew | G01N 21/6489 |
| | | | 235/454 |
| 2010/0064784 A1 | 3/2010 | Caudill et al. | |
| 2010/0069746 A1 | 3/2010 | St. John | |
| 2010/0277193 A1* | 11/2010 | Yonezawa | G01R 1/06727 |
| | | | 324/755.07 |
| 2011/0089965 A1 | 4/2011 | Endres et al. | |
| 2014/0021970 A1 | 1/2014 | Endres et al. | |
| 2015/0079501 A1* | 3/2015 | Shoki | G03F 1/80 |
| | | | 430/5 |
| 2016/0161294 A1 | 6/2016 | Ip et al. | |

\* cited by examiner

PROBES WITH FIDUCIAL TARGETS, PROBE SYSTEMS INCLUDING THE SAME, AND ASSOCIATED METHODS

RELATED APPLICATION

The present application claims priority under 35 U.S.C. § 119(e) to U.S. Provisional Patent Application No. 62/619,282, which was filed on Jan. 19, 2018, the complete disclosure of which is hereby incorporated by reference.

FIELD OF THE DISCLOSURE

The present disclosure relates generally to probes with fiducial targets, probe systems including the same, and associated methods.

BACKGROUND OF THE DISCLOSURE

Probe systems may be utilized to test the operation and/or performance of integrated circuit devices by contacting a contact pad of the integrated circuit device with a probe of the probe system. Integrated circuit devices may include contact pads that are on the order of tens of micrometers (μm) wide. It follows then that aligning a probe with a contact pad requires very precise measurement and manipulation of the locations of the probe and/or contact pad, such as a height of the probe relative to the contact pad. For example, forming an electrical contact between the probe and the contact pad may include contacting the contact pad with a probe tip of the probe and providing a specified amount of overdrive to ensure a robust contact. Achieving robust and repeatable test results may require contacting the contact pad with the probe tip with a precise degree of overdrive, which in turn requires a precise measurement of the height of the probe above the contact pad as the electrical contact is established. Such a measurement may include focusing an optical assembly, such as an optical microscope, on the contact pad and/or the probe. However, identifying and/or focusing on the probe with the optical assembly may be difficult to reliably and consistently accomplish. Thus, there exists a need for probes that include features to facilitate focusing on the probe with an optical assembly in order to precisely identify a spatial height of the probe.

SUMMARY OF THE DISCLOSURE

Probes with fiducial targets, probe systems including the same, and associated methods are disclosed herein. The probes include a probe body, a probe beam extending from the probe body, and at least one probe tip, which extends from a leading edge of the probe beam that is distal the probe body and is configured to contact a device under test (DUT). The probes further include a fiducial target affixed to the probe beam. The fiducial target is configured to be visible to an optical system when the probe tip approaches the DUT to facilitate determination of a position of the probe tip relative to the DUT. The fiducial target is configured to be more optically resolvable by the optical system relative to at least a portion of the probe beam that is adjacent to the fiducial target.

The probe systems are configured to test at least one DUT and include at least one probe configured to test a corresponding DUT of the at least one DUT. The probe systems further include an optical assembly, which is configured to collect an image of at least a portion of at least one probe along an optical axis as the probe approaches the corresponding DUT. The probe systems are configured to enable a determination of a position of at least one fiducial target of at least one probe.

The associated methods include methods of utilizing a probe that includes a fiducial target. These methods include determining a first position of the fiducial target of a probe relative to an optical system, translating the DUT relative to the probe, and determining a second position of the fiducial target relative to the optical system.

The associated methods additionally or alternatively may include methods of manufacturing a probe with a fiducial target. These methods include providing a probe that has a probe beam and a probe tip, and affixing a fiducial target to the probe beam.

DETAILED DESCRIPTION

Figure 1:
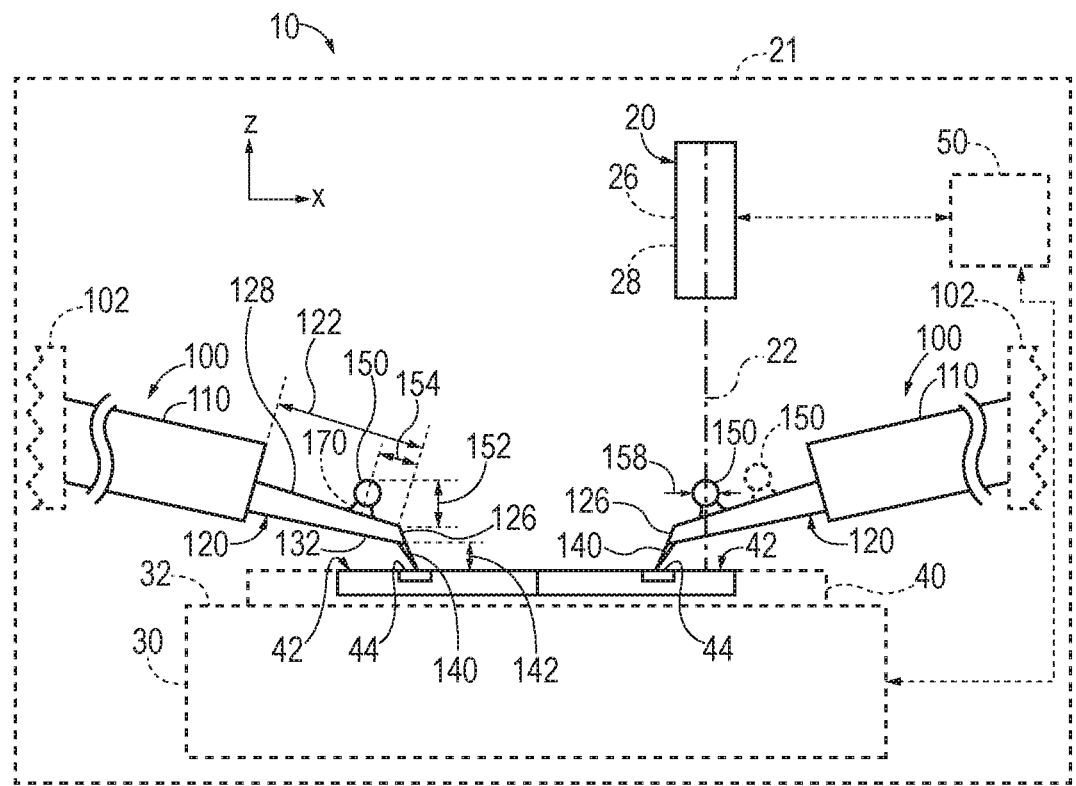
FIG. 1 is a schematic side elevation view illustrating examples of probe systems according to the present disclosure.

FIGS. 1-11 provide examples of probe systems 10 that include probes 100 with fiducial targets 150, of methods 200 of operating and/or utilizing the probe systems, and/or of methods 300 of manufacturing probes with fiducial targets. Elements that serve a similar, or at least substantially similar, purpose are labeled with like numbers in each of FIGS. 1-11, and these elements may not be discussed herein with reference to each of FIGS. 1-11. Similarly, all elements may not be labeled in each of FIGS. 1-11, but reference numerals associated therewith may be utilized herein for consistency. Elements, components, and/or features that are discussed herein with reference to one or more of FIGS. 1-11 may be included in and/or utilized with any of FIGS. 1-11 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a given embodiment without departing from the scope of the present disclosure.

Figure 2:
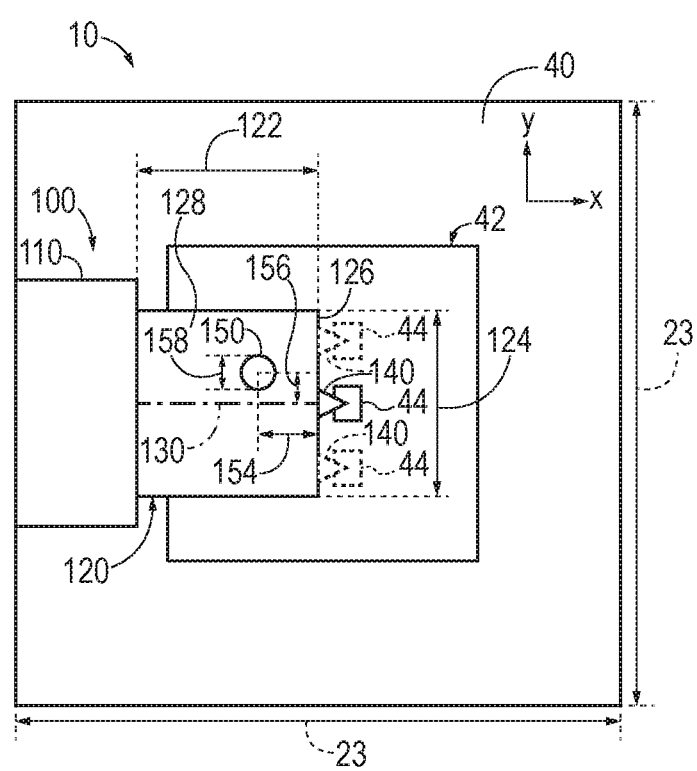
FIG. 2 is a schematic top plan view illustrating examples of a portion of the probe system of FIG. 1.

FIG. 1 is a schematic side elevation view of a probe system 10 that includes a pair of probes 100 according to the present disclosure, and FIG. 2 is a schematic top plan view of a portion of the probe system of FIG. 1. While FIG. 1 schematically illustrates probe system 10 as including two probes 100, this is not required, and it is within the scope of the present disclosure that a probe system may include any appropriate number of probes, such as one probe, two probes, three probes, four probes, or more than four probes. Each probe 100 includes a probe body 110, a probe beam 120 extending from the probe body, and at least one probe tip 140 extending from a leading edge 126 of the probe beam that is distal the probe body. Each probe tip 140 is configured to contact a device under test (DUT) 42, such as via a corresponding contact pad 44 of the DUT. Probe 100 may include any appropriate number of probe tips 140, such as one probe tip, two probe tips, three probe tips, or more than three probe tips. As an example, probe 100 may be a probe configured for radio frequency (RF) testing, and/or may have at least one probe tip 140 configured to transmit and/or receive a signal and/or at least one probe tip configured to provide an electrical ground.

As schematically illustrated in FIGS. 1-2, probe 100 further includes at least one fiducial target 150 affixed to probe beam 120, such as to an upper surface 128 of the probe beam. Each fiducial target 150 is configured to be visible to an optical system 20, as schematically illustrated in FIG. 1, when probe tip 140 approaches DUT 42, such as to facilitate determining a position of probe tip 140 relative to DUT 42, as described herein. In this manner, FIG. 2 may be described as schematically illustrating a portion of probe system 10 of FIG. 1 as viewed by and/or from the perspective of optical system 20. Stated differently, FIG. 2 may be described as schematically illustrating a field of view of optical system 20. As further schematically illustrated in FIGS. 1-2, and as discussed herein, probe system 10 and/or probe 100 may be described with reference to an x-y-z coordinate system in which the x dimension, the y dimension, and the z dimension are mutually orthogonal. More specifically, probe system 10 may be described as being oriented such that optical system 20 views fiducial target 150 along a direction that is at least substantially parallel to the z dimension.

Each probe 100 may include any appropriate number of fiducial targets 150. As an example, several of the probes disclosed herein pertain to an embodiment in which each probe 100 includes a single corresponding fiducial target 150. However, this is not required to all examples of probe 100, and it is additionally within the scope of the present disclosure that each probe may include a plurality of corresponding fiducial targets 150, such as two fiducial targets, three fiducial targets, four fiducial targets, or more than four fiducial targets.

In an embodiment of probe system 10 that includes a plurality of probes 100 with a corresponding plurality of fiducial targets 150, at least one fiducial target of the plurality of fiducial targets may be distinct and/or differently shaped from at least one other fiducial target of the plurality of fiducial targets, such as to facilitate identification of the corresponding probes. Stated differently, in such examples, each probe 100 may include a corresponding fiducial target 150, or a corresponding plurality of fiducial targets 150, that are shaped, sized, positioned, oriented, and/or otherwise configured to enable unique identification of the probe. Additionally or alternatively, in an embodiment of probe 100 that includes a plurality of fiducial targets 150, at least one fiducial target of the plurality of fiducial targets associated with the probe may be distinct and/or differently shaped from at least one other fiducial target of the plurality of fiducial targets associated with the probe, such as to facilitate determination of a position of the probe relative to optical system 20 in three dimensions. As another example, in an embodiment of probe 100 that includes a plurality of fiducial targets 150, at least two fiducial targets of the plurality of fiducial targets may be positioned such that the fiducial targets have different positions in the x dimension, the y dimension, and/or the z dimension, thereby permitting and/or facilitating unique identification of a given probe 100 via observation of fiducial target(s) 150 associated with the given probe.

As further schematically illustrated in FIG. 1, probe system 10 may include a plurality of probe holders 102 configured to support and maintain a corresponding plurality of probes 100 relative to the plurality of DUTs 42. As used herein, probe holder 102 also may be referred to as a positioner 102. Probe system 10 also may include a chuck 30 that defines a support surface 32 configured to support a substrate 40 that includes the plurality of DUTs 42. As additionally schematically illustrated in FIG. 1, probe system 10 may include a controller 50 programmed to control the operation of, or to automate, probe system 10. As an example, controller 50 may be programmed to execute some or all of the methods 200, which are described herein. Additionally or alternatively, controller 50 may be configured to control any suitable component of probe system 10, such as probe 100, optical system 20, and/or chuck 30.

As used herein, positional terms such as "top," "upper," "bottom," "lower," and the like may be used to describe spatial relationships between components of probes 100 and/or of probe systems 10 in an illustrative, non-limiting manner and generally refer to a configuration in which substrate 40 and/or DUT 42 extends at least substantially parallel to a ground surface and probe 100 is vertically above the DUT (e.g., such that a force of gravity biases the probe toward the DUT). Such terms are provided as context only and do not limit component parts of probes 100 and/or of probe systems 10 to always be in a specific orientation relative to ground.

As schematically illustrated in FIG. 1, optical system 20 may be configured to collect an image along an optical axis 22, such as may be at least substantially parallel to the z dimension of probe system 10. For example, optical system 20 may include an illumination light source 26 configured to emit light at least substantially parallel to optical axis 22 to illuminate a portion of probe system 10, such as fiducial target 150 of probe 100. Optical system 20 further may include a microscope 28 configured to collect light that is reflected and/or otherwise emitted from fiducial target 150. Microscope 28 may include and/or be any appropriate microscope, such as a visible light microscope and/or a confocal microscope. As further schematically illustrated in FIG. 1, optical system 20 may include and/or be positioned within an optical enclosure 21 configured to restrict ambient light from entering at least a portion of the optical system, such as microscope 28.

Probe system 10 may be configured such that fiducial target 150 of probe 100 is in focus to optical system 20 when probe tip 140 of the probe approaches DUT 42. More specifically, optical system 20 may have a focus range such that fiducial target 150 and DUT 42 each are within the focus range when the probe tip approaches the DUT, and such that the optical system may focus alternately on the fiducial target and the DUT. Additionally or alternatively, probe system 10 may be configured such that a location of a focal plane of optical system 20 along optical axis 22 may be recorded synchronously with an image of a portion of the probe system that is visible to the optical system. In this manner, and as described herein, probe system 10 may be configured to enable precise determination of a position of fiducial target 150 along a direction parallel to optical axis 22 and/or parallel to the z dimension via a determination of the position of the focal plane at which the fiducial target is maximally in focus.

Probe system 10 also may be configured such that fiducial target 150 and at least one probe tip 140 each are within a field of view of optical system 20 when the probe tip approaches DUT 42. Probe system 10 further may be configured such that fiducial target 150 and at least one probe tip 140 each remain within the field of view of optical system 20 prior to, during, and/or subsequent to testing of DUT 42. For example, testing of DUT 42 may include modulating a temperature of the DUT such that at least a portion of the DUT and/or probe tip 140 thermally drifts with respect to the field of view of optical system 20 during the testing of the DUT. Accordingly, optical system 20 may have a field of view that is sufficiently wide that at least a portion of probe tip 140 and/or fiducial target 150 remains within the field of view of the optical system during testing of DUT 42.

For example, and as schematically illustrated in FIG. 2, the field of view of optical system 20 may have and/or be characterized by a field of view linear dimension 23. Field of view linear dimension 23 may correspond to any appropriate dimension of the field of view. As examples, and as schematically illustrated in FIG. 2, field of view linear dimension 23 may be measured along the x dimension, along the y dimension, and/or along a direction at least substantially perpendicular to optical axis 22. As used herein, field of view linear dimension 23 may correspond to any appropriate metric for measuring the field of view, such as a distance (e.g., a length) and/or a resolution (e.g., a number of pixels spanning the field of view). As examples, field of view linear dimension 23 may be at least 100 micrometers (μm), at least 300 μm, at least 500 μm, at least 1 millimeter (mm), at least 1.5 mm, at least 2 mm, at least 3 mm, at least 5 mm, at most 7 mm, at most 2.5 mm, at most 1.7 mm, at most 1.2 mm, at most 700 μm, and/or at most 200 μm. Additionally or alternatively, field of view linear dimension 23 may be at least 100 pixels, at least 300 pixels, at least 500 pixels, at least 1000 pixels, at least 1300 pixels, at least 1500 pixels, at least 2000 pixels, at least 2500 pixels, at most 3000 pixels, at most 2200 pixels, at most 1700 pixels, at most 1200 pixels, at most 700 pixels, and/or at most 200 pixels.

Optical system 20 generally is configured to collect light from fiducial target 150 to determine a position of probe tip 140 relative to DUT 42, to determine the position of the probe tip relative to the optical system, and/or to detect deflection of the probe tip. For example, optical system 20 may be configured to focus on light reflected from and/or otherwise emitted by fiducial target 150, such that a location of the corresponding focal plane may be used to determine a height of probe tip 140 in a direction parallel to optical axis 22 (such direction being labeled as the z direction in FIG. 1).

More specifically, the light that is reflected from and/or otherwise emitted by fiducial target 150 may provide a high-contrast visual reference point against a relatively non-reflective background, such as may include and/or be probe beam 120. Optical system 20 may be configured to facilitate determining a position of probe tip 140 relative to DUT 42 via any appropriate routine, such as via an automated focus optimization routine. As examples, the focus optimization routine may include and/or be a pattern score routine and/or a gradient search routine. Additionally or alternatively, optical system 20 may be configured to enable a user to manually focus on light reflected from fiducial target 150.

Probe system 10 and/or fiducial target 150 may be configured such that the fiducial target is more optically resolvable by optical system 20 relative to at least a portion of a remainder of the probe system, such as a portion of upper surface 128 of probe beam 120 that supports the fiducial target and/or that is adjacent to the fiducial target. As an example, fiducial target 150 may be more optically resolvable by optical system 20 relative to at least a portion of upper surface 128 of probe beam 120 that is visible to the optical system when the fiducial target is visible to the optical system. As used herein, the phrase "optically resolvable," as used to describe a component within a field of view of an optical system (such as optical system 20), refers generally to an ability of the optical system to precisely and reliably resolve, focus on, and/or otherwise optimize a quality of an image of the component. As more specific examples, probe body 110, probe beam 120, and/or probe tip 140 may be optically opaque and/or optically absorbing. As additional examples, fiducial target 150 may be optically lighter, may be optically brighter, may have a greater optical reflectivity, may have a greater optical contrast, and/or may scatter incident light to a greater extent than at least a portion of upper surface 128 of probe beam 120 that supports the fiducial target. Additionally or alternatively, fiducial target 150 and/or light scattered and/or reflected by the fiducial target may be in focus to optical system 20 within a discrete focal resolution range that is smaller than a focal resolution range over which probe beam 120 is in focus to the optical system. As used herein, a focal resolution range of optical system 20 additionally or alternatively may be referred to as a focus sensitivity of the optical system.

Figure 3:
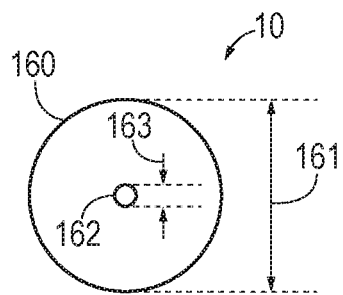
FIG. 3 is a schematic top plan view illustrating an example of a focused light reflection superimposed on a fiducial image according to the present disclosure.

Optical system 20 may be configured to image, render, and/or otherwise represent fiducial target 150 in any appropriate manner. For example, and as schematically illustrated in FIG. 3, optical system 20 may be configured to receive and/or record a fiducial image 160 of at least a portion of fiducial target 150 when probe tip 140 approaches DUT 42 and when the fiducial target is in focus to the optical system. Stated differently, fiducial image 160 may include and/or be an image of at least a portion of fiducial target 150 that is in focus to optical system 20. Additionally or alternatively, and as further schematically illustrated in FIG. 3, fiducial target 150 may be configured to reflect, generate, and/or otherwise produce a focused light reflection 162, and optical system 20 may be configured to receive the focused light reflection 162 from fiducial target 150. In this manner, as used herein, reference to fiducial target 150 being in focus to optical system 20 may refer to fiducial image 160 being in focus to the optical system and/or may refer to focused light reflection 162 being in focus to the optical system. As schematically illustrated in FIG. 3, focused light reflection 162 may be smaller than fiducial image 160, and/or may be superimposed on the fiducial image.

In an example in which optical system 20 is configured to receive fiducial image 160 and focused light reflection 162, the fiducial image may be similar in shape and/or appearance to fiducial target 150, and the focused light reflection may include and/or be a focused spot of light that is narrower and/or more sharply defined than the fiducial image. As more specific examples, and as additionally schematically illustrated in FIG. 3, fiducial image 160 may have and/or be characterized by a fiducial image diameter 161, and focused light reflection 162 may have and/or be characterized by a focused light reflection diameter 163, such that the focused light reflection diameter is smaller than the fiducial image diameter. As still more specific examples, focused light reflection diameter 163 may be at least 0.1% of fiducial image diameter 161, at least 0.2% of the fiducial image diameter, at least 0.5% of the fiducial image diameter, at least 1% of the fiducial image diameter, at least 2% of the fiducial image diameter, at least 5% of the fiducial image diameter, at least 10% of the fiducial image diameter, at least 20% of the fiducial image diameter, at least 50% of the fiducial image diameter, at least 70% of the fiducial image diameter, at most 85% of the fiducial image diameter, at most 60% of the fiducial image diameter, at most 50% of the fiducial image diameter, at most 30% of the fiducial image diameter, at most 25% of the fiducial image diameter, at most 20% of the fiducial image diameter, at most 15% of the fiducial image diameter, at most 10% of the fiducial image diameter, at most 7% of the fiducial image diameter, at most 5% of the fiducial image diameter, at most 3% of the fiducial image diameter, and/or at most 1% of the fiducial image diameter. As another example, focused light reflection diameter 163 of focused light reflection 162 may have a minimum value within a discrete focal resolution range that is smaller than a focal resolution range over which fiducial image diameter 161 of fiducial image 160 has a respective minimum value. As further examples, focused light reflection diameter 163 may be at least 0.00001% of field of view linear dimension 23, at least 0.0001% of the field of view linear dimension, at least 0.001% of the field of view linear dimension, at least 0.01% of the field of view linear dimension, at least 0.1% of the field of view linear dimension, at least 1% of the field of view linear dimension, at least 10% of the field of view linear dimension, at most 20% of the field of view linear dimension, at most 15% of the field of view linear dimension, at most 5% of the field of view linear dimension, at most 1% of the field of view linear dimension, at most 0.5% of the field of view linear dimension, at most 0.05% of the field of view linear dimension, at most 0.005% of the field of view linear dimension, at most 0.0005% of the field of view linear dimension, and/or at most 0.00005% of the field of view linear dimension.

Focused light reflection 162 also may be characterized by a focal resolution range in which the focused light reflection is in focus. For example, the fiducial light reflection may be visible and/or appropriately resolved within a discrete focal resolution range that is smaller than a fiducial target diameter 158 (schematically illustrated in FIGS. 1-2). As more specific examples, the fiducial light reflection may be visible and/or appropriately resolved within a discrete focal resolution range that is at most 50%, at most 30%, at most 25%, at most 20%, at most 15%, at most 10%, at most 7%, at most 5%, at most 3%, and/or at most 1% of fiducial target diameter 158.

Figure 4:
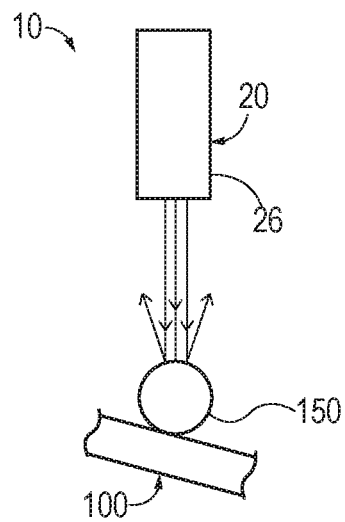
FIG. 4 is a schematic side elevation view illustrating an example of light being reflected from an external surface of a fiducial target according to the present disclosure.
Figure 5:
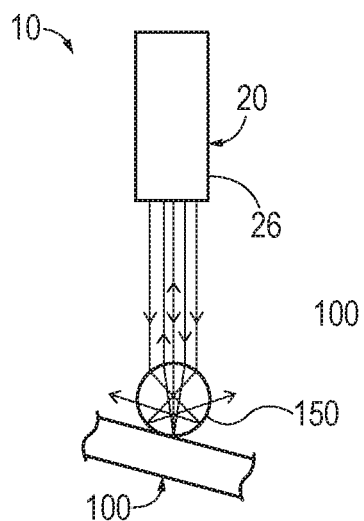
FIG. 5 is a schematic side elevation view illustrating an example of light that is undergoing internal reflection within a fiducial target according to the present disclosure.

Focused light reflection 162 may include and/or be light that is reflected from an exterior surface of fiducial target 150. For example, and as schematically illustrated in FIG. 4, the focused light reflection may include and/or be light that is emitted by illumination light source 26 and subsequently reflected from an external surface of fiducial target 150 that faces the illumination light source. Additionally or alternatively, focused light reflection 162 may include and/or be light that undergoes internal reflection within the fiducial target. For example, and as schematically illustrated in FIG. 5, the focused light reflection may include and/or be light that is emitted by illumination light source 26, that enters fiducial target 150, and that is internally reflected within the fiducial target at least once before exiting the fiducial target and being collected by optical system 20.

Fiducial target 150 may be configured such that fiducial image 160 and/or focused light reflection 162 has a greater optical intensity and/or a greater optical contrast relative to an image of a portion of probe beam 120 that supports the fiducial target and/or that is adjacent to the fiducial target. Hence, optical system 20 may be capable of focusing more precisely on the fiducial image and/or the focused light reflection than on a portion of probe beam 120 that supports and/or is adjacent to fiducial target 150, thereby enabling a more precise measurement of a position of fiducial target 150 along optical axis 22 relative to a probe system 10 that lacks the fiducial target. Additionally or alternatively, fiducial target 150 may be configured such that focused light reflection 162 has a greater optical intensity and/or a greater optical contrast relative to fiducial image 160. In such an embodiment, optical system 20 may be capable of focusing more precisely on the focused light reflection than the fiducial image, thereby enabling a more precise measurement of a position of fiducial target 150 along optical axis 22 relative to a probe system 10 that lacks a fiducial target 150 configured to produce the focused light reflection.

Fiducial target 150 may have any appropriate geometry and/or shape. For example, fiducial target 150 may have at least one axis of symmetry, such as an al symmetry about which the fiducial target is rotationally symmetric. In such an embodiment, the axis of rotational symmetry may extend at least substantially parallel to a probe beam centerline 130 (schematically illustrated in FIG. 2) that extends along upper surface 128 of probe beam 120 from the leading edge toward probe body 110. Fiducial target 150 additionally or alternatively may be rotationally symmetric about an axis of rotational symmetry that extends at least substantially perpendicular to probe beam centerline 130. Such configurations may facilitate optical system 20 being appropriately positioned to receive light reflected by fiducial target 150 without requiring that the fiducial target be affixed to probe beam 120 in a precise and/or predetermined orientation with respect to the probe beam. As an example, fiducial target 150 may be at least substantially spherical, such that the reflective properties of the fiducial target are at least substantially constant as a rotational orientation of the fiducial target with respect to probe beam 120 is varied. As additional examples, fiducial target 150 may be retroreflective, and/or may include and/or be a prism, such as a right prism.

Fiducial target 150 may have any appropriate optical properties, such as to facilitate the formation of fiducial image 160 and/or focused light reflection 162. For example, and as discussed, fiducial target 150 may be at least substantially optically reflective, and optionally fully optically reflective. As a more specific example, fiducial target 150 may include and/or be a metal ball with a fully optically reflective surface. Additionally or alternatively, fiducial target 150 may be at least partially optically transparent and/or at least partially optically translucent. Fiducial target 150 may be formed of any appropriate material, such as a plastic, an acrylic, a metal, and/or a glass, and/or may be formed of a different material than probe body 110, probe beam 120, and/or probe tip 140. As a more specific example, fiducial target 150 may be a glass sphere. In some embodiments, fiducial target 150 may be nonmetallic, such as to avoid electrical interference with a remainder of probe system 10. Fiducial target 150 may be affixed to probe beam 120 in any appropriate manner. As an example, and as schematically illustrated in FIG. 1, fiducial target 150 may be affixed to probe beam 150 by an adhesive 170, such as may include and/or be an epoxy and/or a thermal epoxy.

Probe 100, and/or any component thereof, may have any appropriate dimensions and/or spatial relationships. For example, and as schematically illustrated in FIG. 1, each probe tip 140 may extend from a lower surface 132 of probe beam 120 by a probe tip height 142, as measured parallel to optical axis 22 when the probe tip approaches DUT 42. As more specific examples, probe tip height 142 may be at least 10 µm, at least 50 µm, at least 100 µm, at least 150 µm, at least 200 µm, at least 250 µm, at least 300 µm, at least 350 µm, at least 400 µm, at least 450 µm, at most 500 µm, at most 475 µm, at most 425 µm, at most 375 µm, at most 325 µm, at most 275 µm, at most 225 µm, at most 175 µm, at most 125 µm, at most 75 µm, and at most 25 µm.

Similarly, fiducial target 150 may have any appropriate spatial relationship relative to probe beam 120, such as to facilitate optical system 20 focusing on light scattered and/or reflected by the fiducial target. As an example, and as schematically illustrated in FIG. 1, fiducial target 150 may extend above upper surface 128 of probe beam 120 by a fiducial target height 152, as measured in a direction parallel to optical axis 22 when probe tip 140 approaches DUT 42. As more specific examples, fiducial target height 152 may be at least 25 µm, at least 50 µm, at least 100 µm, at least 200 µm, at least 300 µm, at least 400 µm, at least 500 µm, at least 600 µm, at least 700 µm, at least 800 µm, at least 900 µm, at most 1000 µm, at most 950 µm, at most 850 µm, at most 750 µm, at most 650 µm, at most 550 µm, at most 450 µm, at most 350 µm, at most 250 µm, at most 150 µm, and/or at most 75 µm. In an embodiment in which fiducial target 150 is affixed to probe beam 120 by adhesive 170, the adhesive may serve to retain the fiducial target in a position that is spaced apart from the probe beam, such that fiducial target height 152 is greater than fiducial target diameter 158. However, this is not required, and it is within the scope of the present disclosure that fiducial target height 152 may be equal to or less than fiducial target diameter 158. For example, fiducial target 150 may be affixed to probe beam 120 such that the fiducial target is at least partially recessed into the probe beam. As another example, fiducial target 150 may include only a portion of a sphere.

As another example, and as schematically illustrated in FIGS. 1-2, fiducial target 150 may be spaced apart from leading edge 126 of probe beam 120 by an on-axis offset 154, as measured in a direction parallel to probe beam centerline 130. As more specific examples, on-axis offset 154 may be at least 50 µm, at least 100 µm, at least 200 µm, at least 300 µm, at least 400 µm, at most 450 µm, at most 350 µm, at most 250 µm, at most 150 µm, and/or at most 75 µm. Additionally or alternatively, on-axis offset 154 may be measured with respect to a probe beam length 122 of probe beam 120, as measured along a direction parallel to probe beam centerline 130. As examples, on-axis offset 154 may be at most 0.5 times probe beam length 122, at most 0.3 times the probe beam length, at most 0.25 times the probe beam length, at most 0.1 times the probe beam length, at most 0.05 times the probe beam length, and/or at most 0.01 times the probe beam length. Additionally or alternatively, on-axis offset 154 may be measured with respect to a probe beam width 124, which, as illustrated in FIG. 2, may be measured along a direction parallel to a line that extends across probe beam 120 perpendicular to probe beam centerline 130 and that intersects a center of fiducial target 150. As examples, on-axis offset 154 may be at most 5 times probe beam width 124, at most 3 times the probe beam width, at most 2 times the probe beam width, at most equal to the probe beam width, at most 0.5 times the probe beam width, at most 0.25 times the probe beam width, and/or at most 0.1 times the probe beam width.

Additionally or alternatively, and as schematically illustrated in FIG. 2, fiducial target 150 may be spaced apart from probe beam centerline 130 by a cross-axis offset 156, as measured along upper surface 128 of probe beam 120 and in a direction perpendicular to the probe beam centerline. As more specific examples, cross-axis offset 156 may be at least 50 µm, at least 100 µm, at least 200 µm, at least 300 µm, at least 400 µm, at most 450 µm, at most 350 µm, at most 250 µm, at most 150 µm, and/or at most 75 µm.

Fiducial target 150 may have any appropriate size. For example, and as schematically illustrated in FIGS. 1-2, fiducial target 150 may have and/or be characterized by a diameter 158 that is at least 25 µm, at least 50 µm, at least 100 µm, at least 200 µm, at least 300 µm, at least 400 µm, at least 500 µm, at least 600 µm, at least 700 µm, at least 800 µm, at least 900 µm, at most 1000 µm, at most 950 µm, at most 850 µm, at most 750 µm, at most 650 µm, at most 550 µm, at most 450 µm, at most 350 µm, at most 250 µm, at most 150 µm, and/or at most 75 µm. In general, a smaller fiducial target diameter 158 may yield a narrower and/or more sharply defined focused light reflection 162, which may facilitate a more precise measurement of a spatial location of fiducial target 150. Additionally or alternatively, it also may be desirable that fiducial target diameter 158 be sufficiently large that focused light reflection 162 is visible to optical system 20 with a sufficient signal to noise ratio to be unambiguously optically resolvable. Stated differently, focused light reflection diameter 163 may be related to fiducial target diameter 158 such that the focused light reflection diameter is a sufficiently large proportion of field of view linear dimension 23 when the fiducial target diameter 158 is sufficiently large.

Figure 6:
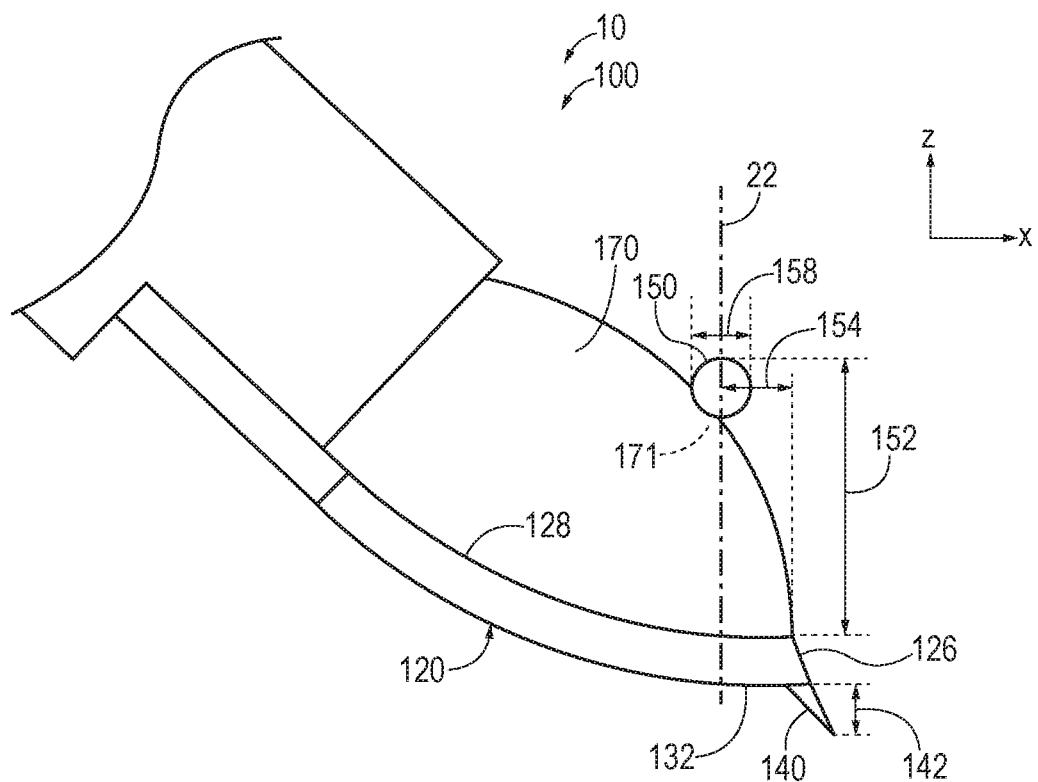
FIG. 6 is a fragmentary side elevation view illustrating an example of a portion of a probe according to the present disclosure.
Figure 7:
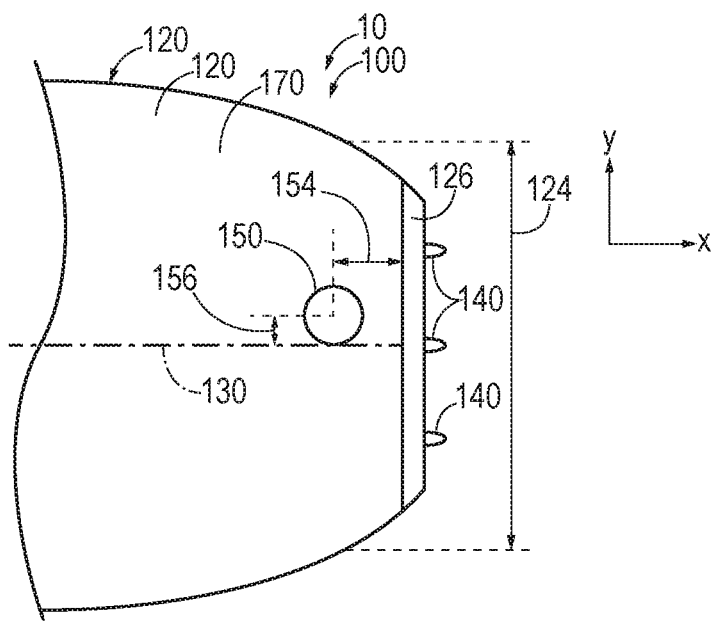
FIG. 7 is a fragmentary top elevation view of the probe of FIG. 6.

FIGS. 6-7 are less schematic illustrations of an example of a portion of probe 100 that includes three probe tips 140 and fiducial target 150 in the form of a glass sphere that is affixed to probe beam 120 by adhesive 170. In the example of FIGS. 6-7, adhesive 170 serves to maintain the bottom of fiducial target 150 above upper surface 128 of probe beam 120, such that fiducial target height 152 is greater than fiducial target diameter 158. As illustrated in FIG. 7, adhesive 170 may partially and/or substantially cover upper surface 128 of probe beam 120, and/or fiducial target 150 may be partially and/or substantially embedded in the adhesive. Additionally or alternatively, and as further illustrated in FIG. 7, probe 100 may include a first adhesive 170, such as an epoxy, that substantially covers upper surface 128 of probe beam 120, and fiducial target 150 may be affixed to the first adhesive via a second adhesive 171. In such embodiments, adhesive 170 may enhance a rigidity of at least a portion of probe beam 120, such as to maintain a substantially fixed positional relationship between fiducial target 150 and probe tip 140. As best seen in FIG. 7, FIGS. 6-7 additionally may be described as illustrating an example of probe 100 in which fiducial target 150 is spaced apart from probe beam centerline 130 by cross-axis offset 156.

Figure 8:
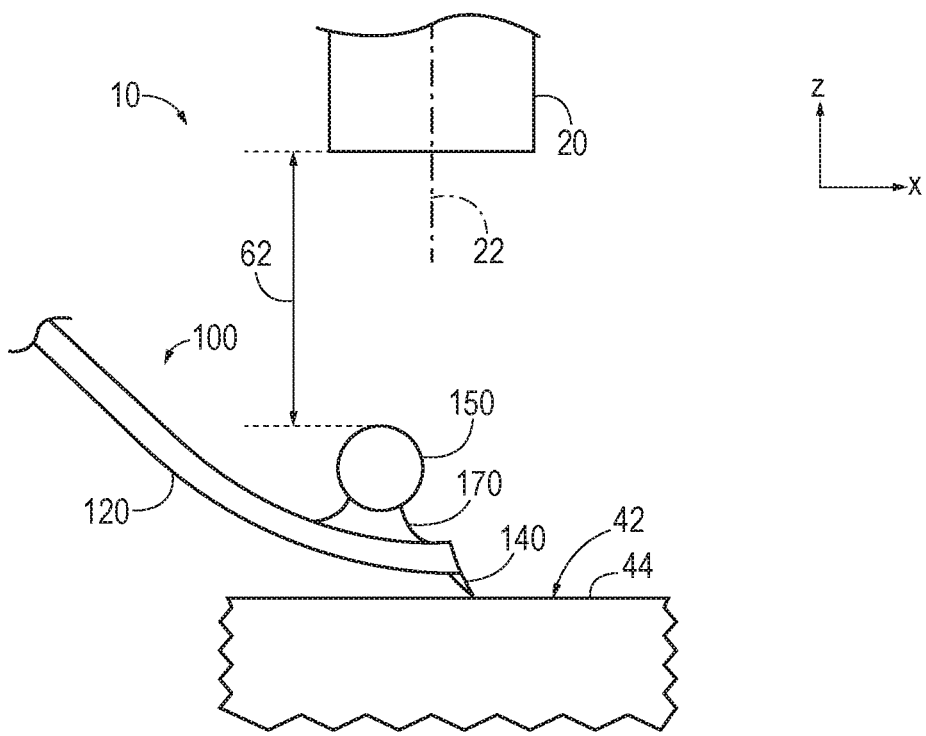
FIG. 8 is a schematic side elevation view illustrating a probe tip contacting a DUT according to the present disclosure prior to overdriving the DUT with respect to the probe tip.
Figure 9:
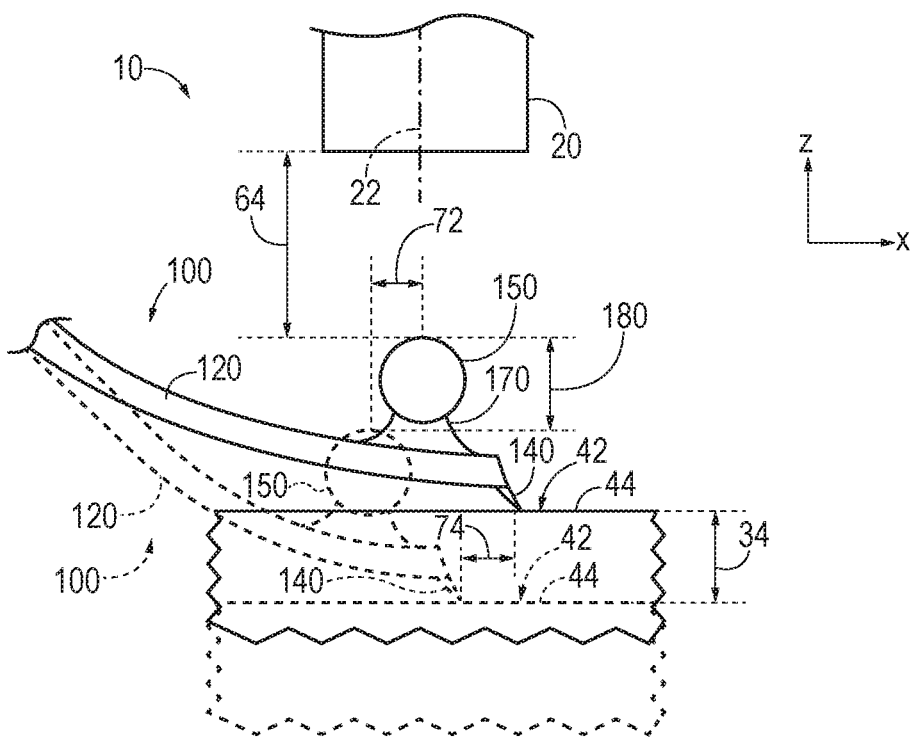
FIG. 9 is a schematic side elevation view illustrating the probe tip and DUT of FIG. 8 subsequent to overdriving the DUT with respect to the probe tip.

FIGS. 8-9 schematically illustrate an example of overdriving DUT 42 with respect to probe 100 (or, equivalently, of overdriving probe 100 with respect to DUT 42). Specifically, FIG. 8 illustrates a configuration of a portion of probe system 10 in which probe tip 140 is brought into contact with DUT 42, while FIG. 9 illustrates the probe system of FIG. 8 after the DUT has been translated upwards with respect to the probe (i.e., with the probe held substantially fixed). As schematically illustrated in FIGS. 8-9, probe beam 120 may be configured to transition between a nominal position with respect to probe body 110 (illustrated in FIG. 8 and in dashed lines in FIG. 9) and a deflected position with respect to the probe body (illustrated in solid lines in FIG. 9). Stated differently, probe beam 120 may be configured to bend, deflect, and/or otherwise resiliently deform responsive to a force applied to probe tip 140. Such a configuration may facilitate an overdrive of DUT 42 with respect to probe 100 (as discussed in more detail herein with respect to methods 200), such as to ensure a robust electrical contact between probe tip 140 and the DUT.

As discussed, fiducial target 150 may facilitate overdriving DUT 42 with respect to probe 100 with a precise and/or consistent degree of overdrive. For example, and as schematically illustrated in FIG. 9, overdriving DUT 42 with respect to probe 100 may correspond to the DUT being translated by a DUT overdrive distance 34, and/or may correspond with a portion of probe 100 (such as fiducial target 150) being translated along a direction substantially parallel to optical axis 22 by a probe overdrive distance 180, which may be substantially equal to the DUT overdrive distance. Hence, a measurement of a height of fiducial target 150 (such as may be facilitated by focusing optical system 20 on light reflected by the fiducial target) while DUT 42 and probe 100 are brought into and/or out of contact with one another, and/or while probe beam 120 is transitioned between the nominal position and the deflected position, may provide a measurement of probe overdrive distance 180 and/or of DUT overdrive distance 34. More specifically, focusing optical system 20 on light reflected by fiducial target 150 prior to overdriving DUT 42 with respect to probe 100 may provide a measurement of a first height offset 62 (illustrated in FIG. 8) between the optical system and the fiducial target, as measured along a direction at least substantially parallel to optical axis 22. Similarly, focusing the optical system on light reflected by the fiducial target subsequent to overdriving the DUT with respect to the probe may provide a measurement of a second height offset 64 (illustrated in FIG. 9) between the optical system and the fiducial target, as measured along a direction at least substantially parallel to optical axis 22. Accordingly, probe overdrive distance 180 may be calculated as a difference between first height offset 62 and second height offset 64.

As further schematically illustrated in FIGS. 8-9, overdriving DUT 42 with respect to probe 100 may correspond to a portion of probe 100 being translated along a direction substantially perpendicular to optical axis 22. As examples, and as schematically illustrated in FIG. 9, overdriving DUT 42 with respect to probe 100 may correspond to fiducial target 150 being translated along a direction substantially perpendicular to optical axis 22 by a fiducial target lateral displacement 72, and/or may correspond to probe tip 140 being translated along a direction substantially perpendicular to the optical axis by a probe tip lateral displacement 74. For example, and as schematically illustrated in FIG. 9, fiducial target lateral displacement 72 may be proportional to, or at least substantially equal to, probe tip lateral displacement 74. In this manner, a direct measurement of fiducial target lateral displacement 72 may serve as an indirect measurement of probe tip lateral displacement 74. As schematically illustrated in FIG. 9, fiducial target lateral displacement 72 and/or probe tip lateral displacement 74 may correspond to displacements along a direction substantially parallel to an x dimension of probe system 10. However, it is additionally within the scope of the present disclosure that fiducial target lateral displacement 72 and/or probe tip lateral displacement 74 may have a component that is perpendicular to the x dimension (i.e., the y dimension as illustrated in FIG. 7).

While the foregoing discussion is primarily directed to utilizing fiducial targets 150 in conjunction with probes 100 including probe tips 140 configured to make physical and/or electrical contact with DUTs 42, this is not required, and fiducial target 150 may be utilized in conjunction with any appropriate system. As an example, a probing system may include at least one optical fiber configured to transmit and/or receive an optical signal. In such examples, each probe 100 may include and/or be the optical fiber, and DUT 42 may include a corresponding at least one grating coupler configured to send an optical signal to and/or receive an optical signal from the optical fiber without physically contacting the optical fiber. In such a system, robust optical coupling between the optical fiber and the grating coupler may require precise mechanical and/or spatial alignment between the optical fiber and the grating coupler. Accordingly, fiducial target 150 may be utilized in conjunction with, or attached to, an optical fiber (or an array of optical fibers) to facilitate alignment of the optical fiber (or array of optical fibers) with a corresponding grating coupler (or array of grating couplers) in a manner that is similar to what is described herein with reference to physical and/or electrical contact between probe tips 140 and DUTs 42.

Figure 10:
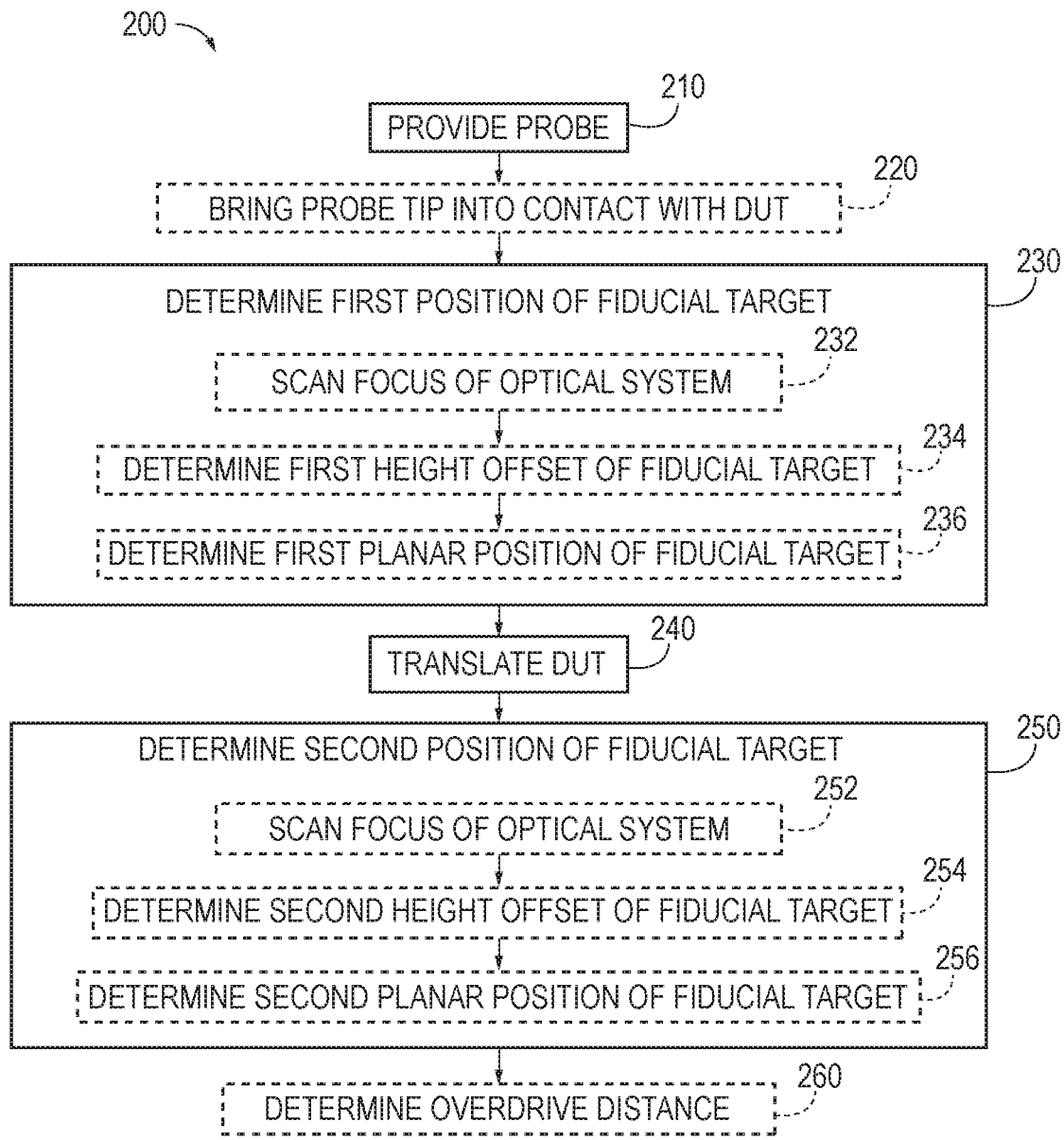
FIG. 10 is a flowchart depicting methods, according to the present disclosure, of measuring an overdrive distance of a probe with respect to a DUT.

FIG. 10 is a flowchart depicting methods 200, according to the present disclosure, of utilizing a probe (such as probe 100) that includes a fiducial target (such as fiducial target 150). Methods 200 include providing, at 210, a probe that includes a probe body (such as probe body 110), a probe beam (such as probe beam 120), at least one probe tip (such as probe tip 140) extending from the probe beam, and the fiducial target affixed to the probe beam. The providing at 210 may include providing a probe that is configured to contact a DUT (such as DUT 42), and may include obtaining, purchasing, and/or manufacturing the probes. Additionally or alternatively, the providing at 210 may include utilizing a probe that forms a portion of a probe system (such as probe system 10) to perform methods 200.

As shown in FIG. 10, methods 200 additionally include determining, at 230, a first position of the fiducial target relative to an optical system (such as optical system 20); translating the DUT relative to the probe at 240; and determining at 250, a second position of the fiducial target relative to the optical system.

The determining the first position at 230 generally includes utilizing the optical system to focus on a focused light reflection (such as focused light reflection 162) that is reflected and/or otherwise emitted by the fiducial target. The focused light reflection may include and/or be light that is internally reflected within the fiducial target and/or light that is reflected from an external surface of the fiducial target. As shown in FIG. 10, the determining at 230 may include scanning a focus of the optical system at 232 to focus on the focused light reflection.

As an example, the scanning at 232 may include translating a focus plane of the optical system along an optical axis (such as optical axis 22) of the optical system while recording a series of images of at least a portion of the probe with the optical system. In this manner, the series of images may enable a determination of the first position of the fiducial target. For example, and as shown in FIG. 10, the determining at 230 additionally may include determining, at 234, a first height offset (such as first height offset 62) between the optical system and the fiducial target, as measured along a direction parallel to the optical axis. As a more specific example, the determining at 234 may include analyzing the series of images produced during the scanning at 232 to identify a position of the focal plane at which the focused light reflection is maximally in focus.

The determining at 234 may be performed manually, and/or may be performed at least partially automatically, such as via a focus optimization routine. As examples, the focus optimization routine may include and/or be a pattern score routine and/or a gradient search routine. As another example, and as further shown in FIG. 10, the determining at 230 additionally may include determining, at 236, a first planar position of the fiducial target, as measured along a direction perpendicular to the optical axis. As a more specific example, the determining at 236 may include identifying a location within the field of view of the optical system at which the focused light reflection appears when the focused light reflection is maximally in focus. In this manner, the first position of the fiducial target may correspond to a position of the fiducial target along an x dimension, along a y dimension, and/or along a z dimension, and/or may correspond to a three-dimensional position of the fiducial target relative to the optical system.

The translating the DUT relative to the probe at 240 may include translating along any appropriate direction. As an example, the translating at 240 may include translating the DUT while the probe is maintained in a substantially stationary position. In such an example, the translating at 240 may serve to deflect the probe beam with respect to the probe body, and/or may be described as overdriving the DUT with respect to the probe. Additionally or alternatively, the translating the DUT relative to the probe at 240 may include translating the probe while maintaining the DUT in a substantially stationary position. In such an example, the translating at 240 also may be described as overdriving the probe with respect to the DUT. The translating at 240 may include translating the DUT and/or the probe toward one another, or may include translating the DUT and the probe away from one another, such as by translating the DUT and/or the probe along the optical axis.

As further shown in FIG. 10, methods 200 include, subsequent to the translating at 240, determining, at 250, a second position of the fiducial target relative to the optical system. The determining the second position at 250 generally includes utilizing the optical system to focus on the focused light reflection that is reflected and/or otherwise emitted by the fiducial target subsequent to the translating at 240. As shown in FIG. 10, the determining at 250 may include scanning a focus of the optical system at 252 to focus on the focused light reflection. As an example, the scanning at 252 may include translating the focus plane of the optical system along the optical axis of the optical system while recording a series of images of at least a portion of the probe with the optical system. In this manner, the series of images may enable a determination of the second position of the fiducial target.

For example, and as shown in FIG. 10, the determining at 250 additionally may include determining, at 254, a second height offset (such as second height offset 64) between the optical system and the fiducial target, as measured along a direction parallel to the optical axis. As a more specific example, the determining at 254 may include analyzing the series of images produced during the scanning at 252 to identify a position of the focal plane at which the focused light reflection is maximally in focus. The determining at 254 may be performed manually, and/or may be performed at least partially automatically, such as via a focus optimization routine. As examples, the focus optimization routine may include and/or be a pattern score routine and/or a gradient search routine. As another example, and as further shown in FIG. 10, the determining at 250 additionally may include determining, at 256, a second planar position of the fiducial target, as measured along a direction perpendicular to the optical axis. As a more specific example, the determining at 256 may include identifying a location within the field of view of the optical system at which the focused light reflection appears when the focused light reflection is maximally in focus. In this manner, the second position of the fiducial target may correspond to a position of the fiducial target along an x dimension, along a y dimension, and/or along a z dimension, and/or may correspond to a three-dimensional position of the fiducial target relative to the optical system.

As further shown in FIG. 10, methods 200 additionally may include, prior to the determining the first position of the fiducial target at 230, bringing the probe tip into contact with the DUT at 220. The bringing at 220 may include translating the probe tip with respect to the DUT to bring the probe tip into physical and/or electrical contact with a portion of the DUT, such as to enable the probe to perform an electrical measurement of the DUT. The bringing at 220 may include independently translating the probe and/or the DUT in a direction that is perpendicular, or at least substantially perpendicular, to a contacting surface of the DUT. During and/or as a result of the bringing at 220, the probe tip may scrub, or skate, on and/or across at least a portion of the contacting surface of the DUT. Such scrubbing may improve electrical contact between the probe tip and the DUT. The bringing at 220 may be performed manually, or may be performed at least partially autonomously.

As further shown in FIG. 10, methods 200 additionally may include determining the overdrive distance at 260, such that the determining is based, at least in part, on a difference between the first position of the fiducial target and the second position of the fiducial target. For example, the overdrive distance may be equal to a difference between the first height offset and the second height offset.

Figure 11:
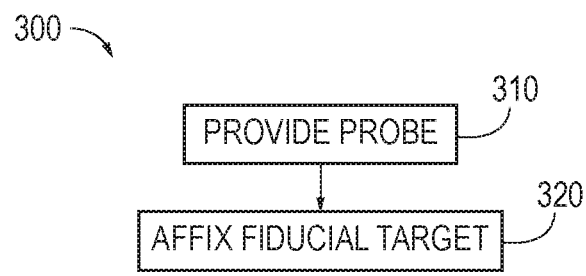
FIG. 11 is a flowchart depicting methods, according to the present disclosure, of manufacturing a probe with a fiducial target.

FIG. 11 is a flowchart depicting methods 300, according to the present disclosure, of manufacturing a probe with a fiducial target. Methods 300 include providing, at 310, a probe (such as probe 100) that has a probe beam (such as probe beam 120) and at least one probe tip (such as probe tip 140). Methods 300 further include affixing a fiducial target (such as fiducial target 150) to the probe beam at 320.

The providing at 310 may include providing a probe that is configured to contact a DUT, and may include obtaining, purchasing, and/or manufacturing the probes. Additionally or alternatively, the providing at 310 may include utilizing a probe that forms a portion of a probe system (such as probe system 10) to perform methods 200.

The affixing at 320 may include affixing the fiducial target to an upper surface of the probe beam (such as upper surface 128 of probe beam 120), and/or may include affixing the fiducial target to the probe beam such that at least a portion of the fiducial target is visible to an optical system (such as optical system 20) when the probe approaches a DUT. The affixing at 320 may include adhering the fiducial target to the probe beam with an adhesive (such as adhesive 170), which may include and/or be an epoxy, such as a thermal epoxy. The affixing at 320 may include positioning the fiducial target at a predetermined orientation with respect to the probe beam, such as to ensure that the optical system may collect light that is reflected from the fiducial target. Alternatively, in an embodiment in which the fiducial target is a rotationally symmetric and/or rotationally invariant shape such as a sphere, it may be unnecessary to position the fiducial target at a predetermined orientation with respect to the probe beam, since the reflective properties of such a fiducial target may be at least partially independent of the orientation of the fiducial target with respect to the probe beam.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It also is within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" may mean A alone, B alone, C alone, A and B together, A and C together, B and C together, A, B, and C together, and optionally any of the above in combination with at least one other entity.

As used herein, "at least substantially," when modifying a degree or relationship, includes not only the recited "substantial" degree or relationship, but also the full extent of the recited degree or relationship. A substantial amount of a recited degree or relationship may include at least 75% of the recited degree or relationship. For example, an object that is at least substantially optically reflective include an object that has an optical reflectance of at least 75%. As another example, a first direction that is at least substantially parallel to a second direction includes a direction such that an inner product of a unit vector along the first direction and a unit vector along the second direction has a magnitude of at least 0.75.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It also is within the scope of the present disclosure that elements, components, and/or other recited subject matter that is recited as being adapted to perform a particular function may additionally or alternatively be described as being configured to perform that function, and vice versa.

As used herein, the phrase "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

Illustrative, non-exclusive examples of probes, probe systems, and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe for a probe system, the probe comprising:
a probe body;
a probe beam extending from the probe body;
at least one probe tip extending from a leading edge of the probe beam distal the probe body and configured to contact a device under test (DUT); and
at least one fiducial target affixed to the probe beam;
wherein the fiducial target is configured to be visible to an optical system when the probe tip approaches the DUT to facilitate determining a position of the at least one probe tip relative to the DUT.

A2. The probe of paragraph A1, wherein the fiducial target is affixed to an upper surface of the probe beam.

A3. The probe of any of paragraphs A1-A2, wherein the at least one probe tip includes one probe tip, two probe tips, three probe tips, or more than three probe tips.

A4. The probe of any of paragraphs A1-A3, wherein the probe beam is configured to resiliently bend and/or deflect to transition between a nominal position with respect to the probe body and a deflected position with respect to the probe body.

A5. The probe of any of paragraphs A1-A4, wherein the fiducial target is configured to be more optically resolvable by the optical system relative to at least a portion of a/the upper surface of the probe beam that supports and/or is adjacent to the fiducial target.

A6. The probe of paragraph A5, wherein the fiducial target is at least one of optically lighter and optically brighter than at least a portion of the upper surface of the probe beam that supports and/or is adjacent to the fiducial target.

A7. The probe of any of paragraphs A5-A6, wherein the fiducial target has at least one of a greater optical reflectivity and a greater optical contrast than at least a portion of the upper surface of the probe beam that supports and/or is adjacent to the fiducial target.

A8. The probe of any of paragraphs A5-A7, wherein the fiducial target scatters incident light to a greater extent than at least a portion of the upper surface of the probe beam that supports and/or is adjacent to the fiducial target.

A9. The probe of any of paragraphs A1-A8, wherein the fiducial target is configured to be in focus to the optical system within a discrete focal resolution range of the optical system that is smaller than a focal resolution range over which the probe beam is in focus to the optical system.

A10. The probe of any of paragraphs A1-A9, wherein the probe system is configured such that the fiducial target is in focus to the optical system when the probe tip approaches the DUT.

A11. The probe of any of paragraphs A1-A10, wherein the optical system has a focus range, and wherein the fiducial target and the DUT each are within the focus range when the probe tip approaches the DUT.

A12. The probe of any of paragraphs A1-A11, wherein the optical system is configured to receive a fiducial image of at least a portion of the fiducial target when the probe tip approaches the DUT and when the fiducial target is in focus to the optical system.

A13. The probe of any of paragraphs A1-A12, wherein the fiducial target is configured to produce a focused light reflection, and wherein the optical system is configured to receive the focused light reflection from the fiducial target.

A14. The probe of paragraph A13, when dependent from paragraph A12, wherein the focused light reflection is smaller than the fiducial image.

A15. The probe of paragraph A14, wherein the fiducial image has a fiducial image diameter, and wherein the focused light reflection has a focused light reflection diameter that is at least one of at least 0.1% of the fiducial image diameter, at least 0.2% of the fiducial image diameter, at least 0.5% of the fiducial image diameter, at least 1% of the fiducial image diameter, at least 2% of the fiducial image diameter, at least 5% of the fiducial image diameter, at least 10% of the fiducial image diameter, at least 20% of the fiducial image diameter, at least 50% of the fiducial image diameter, at least 70% of the fiducial image diameter, at most 85% of the fiducial image diameter, at most 60% of the fiducial image diameter, at most 50% of the fiducial image diameter, at most 30% of the fiducial image diameter, at most 25% of the fiducial image diameter, at most 20% of the fiducial image diameter, at most 15% of the fiducial image diameter, at most 10% of the fiducial image diameter, at most 7% of the fiducial image diameter, at most 5% of the fiducial image diameter, at most 3% of the fiducial image diameter, and at most 1% of the fiducial image diameter.

A16. The probe of any of paragraphs A14-A15, wherein the focused light reflection has a/the focused light reflection diameter, and wherein the focused light reflection diameter is at least one of at least 0.00001% of a field of view linear dimension of the optical system, at least 0.0001% of the field of view linear dimension, at least 0.001% of the field of view linear dimension, at least 0.01% of the field of view linear dimension, at least 0.1% of the field of view linear dimension, at least 1% of the field of view linear dimension, at least 10% of the field of view linear dimension, at most 20% of the field of view linear dimension, at most 15% of the field of view linear dimension, at most 5% of the field of view linear dimension, at most 1% of the field of view linear dimension, at most 0.5% of the field of view linear dimension, at most 0.05% of the field of view linear dimension, at most 0.005% of the field of view linear dimension, at most 0.0005% of the field of view linear dimension, and at most 0.00005% of the field of view linear dimension.

A17. The probe of any of paragraphs A13-A16, wherein the fiducial light reflection is visible within a/the discrete focal resolution range that is at least one of at most 50%, at most 30%, at most 25%, at most 20%, at most 15%, at most 10%, at most 7%, at most 5%, at most 3%, and at most 1% of a fiducial target diameter of the fiducial target.

A18. The probe of any of paragraphs A13-A17, wherein the focused light reflection includes, and optionally is, light that is reflected from an exterior surface of the fiducial target.

A19. The probe of any of paragraphs A13-A18, wherein the focused light reflection includes light that undergoes internal reflection within the fiducial target.

A20. The probe of any of paragraphs A1-A19, wherein the fiducial target is configured such that at least one of a/the fiducial image and a/the focused light reflection has at least one of a greater optical intensity and a greater optical contrast relative to an image of a portion of the probe beam that supports the fiducial target.

A21. The probe of any of paragraphs A13-A20, when dependent from paragraph A16, wherein the fiducial target is configured such that the focused light reflection has at least one of a greater optical intensity and a greater optical contrast relative to the fiducial image.

A22. The probe of any of paragraphs A1-A21, wherein the optical system is configured to collect an image along an optical axis, and wherein each of the at least one probe tip extends from a lower surface of the probe beam by a probe tip height, as measured parallel to the optical axis when the probe tip approaches the DUT, that is at least one of at least 10 μm, at least 50 μm, at least 100 μm, at least 150 μm, at least 200 μm, at least 250 μm, at least 300 μm, at least 350 μm, at least 400 μm, at least 450 μm, at most 500 μm, at most 475 μm, at most 425 μm, at most 375 μm, at most 325 μm, at most 275 μm, at most 225 μm, at most 175 μm, at most 125 μm, at most 75 μm, and at most 25 μm.

A23. The probe of any of paragraphs A1-A22, wherein the optical system is configured to collect an image along a/the optical axis, and wherein the fiducial target extends above an/the upper surface of the probe beam by a fiducial target height, as measured in a direction parallel to the optical axis when the probe tip approaches the DUT, that is at least one of at least 25 μm, at least 50 μm, at least 100 μm, at least 200 μm, at least 300 μm, at least 400 μm, at least 500 μm, at least 600 μm, at least 700 μm, at least 800 μm, at least 900 μm, at most 1000 μm, at most 950 μm, at most 850 μm, at most 750 μm, at most 650 μm, at most 550 μm, at most 450 μm, at most 350 μm, at most 250 μm, at most 150 μm, and at most 75 μm.

A24. The probe of any of paragraphs A1-A23, wherein the fiducial target is spaced apart from the leading edge by an on-axis offset, as measured along a direction parallel to a probe beam centerline that extends along an/the upper surface of the probe beam from the leading edge toward the probe body, that is at least one of at least 50 μm, at least 100 μm, at least 200 μm, at least 300 μm, at least 400 μm, at most 450 μm, at most 350 μm, at most 250 μm, at most 150 μm, and at most 75 μm.

A25. The probe of any of paragraphs A1-A24, wherein the probe beam has a probe beam length, as measured along a direction parallel to a/the probe beam centerline that extends along a/the upper surface of the probe beam from the leading edge to the probe body, wherein the fiducial target is spaced apart from the leading edge by a/the on-axis offset, as measured along a direction parallel to the probe beam centerline from the leading edge toward the probe body, and wherein the on-axis offset is at least one of at most 0.5 times the probe beam length, at most 0.3 times the probe beam length, at most 0.25 times the probe beam length, at most 0.1 times the probe beam length, at most 0.05 times the probe beam length, and at most 0.01 times the probe beam length.

A26. The probe of any of paragraphs A1-A25, wherein the probe beam has a probe beam width, as measured along a direction parallel to a line that extends across the probe beam perpendicular to a/the probe beam centerline that extends along a/the upper surface of the probe beam from the leading edge to the probe body and that intersects a center of the fiducial target, wherein the fiducial target is spaced apart from the leading edge by a/the on-axis offset, as measured along a direction parallel to the probe beam centerline from the leading edge toward the probe body, and wherein the on-axis offset is at least one of at most 5 times the probe beam width, at most 3 times the probe beam width, at most 2 times the probe beam width, at most equal to the probe beam width, at most 0.5 times the probe beam width, at most 0.25 times the probe beam width, and/or at most 0.1 times the probe beam width.

A27. The probe of any of paragraphs A1-A26, wherein the fiducial target is spaced apart from a/the probe beam centerline that extends along a/the upper surface of the probe beam from the leading edge toward the probe body by a cross-axis offset, as measured along the upper surface of the probe beam and in a direction perpendicular to the probe beam centerline, that is at least one of at least 50 μm, at least 100 μm, at least 200 μm, at least 300 μm, at least 400 μm, at most 450 μm, at most 350 μm, at most 250 μm, at most 150 μm, and at most 75 μm.

A28. The probe of any of paragraphs A1-A27, wherein one or more of the probe tip, the probe beam, and the probe body is optically opaque.

A29. The probe of any of paragraphs A1-A28, wherein one or more of the probe tip, the probe beam, and the probe body is optically absorbing.

A30. The probe of any of paragraphs A1-A29, wherein the fiducial target includes at least one axis of symmetry.

A31. The probe of paragraph A30, wherein the fiducial target is rotationally symmetric about an axis of rotational symmetry that extends at least substantially parallel to a/the probe beam centerline.

A32. The probe of any of paragraphs A28-A31, wherein the fiducial target is rotationally symmetric about an axis of rotational symmetry that extends at least substantially perpendicular to a/the probe beam centerline.

A33. The probe of any of paragraphs A28-A32, wherein the fiducial target is at least substantially spherical.

A34. The probe of any of paragraphs A28-A33, wherein the fiducial target includes only a portion of a sphere.

A35. The probe of any of paragraphs A1-A34, wherein the fiducial target includes a prism, optionally a right prism.

A36. The probe of any of paragraphs A1-A35, wherein the fiducial target is at least substantially optically reflective, and optionally fully optically reflective.

A37. The probe of paragraph A36, wherein the fiducial target includes a metal ball with a fully optically reflective surface.

A38. The probe of any of paragraphs A36-A37, wherein the fiducial target is retroreflective.

A39. The probe of any of paragraphs A1-A38, wherein the fiducial target is at least partially optically transparent.

A40. The probe of any of paragraphs A1-A39, wherein the fiducial target is at least partially optically translucent.

A41. The probe of any of paragraphs A1-A40, wherein a/the fiducial target diameter is at least one of at least 25 μm, at least 50 μm, at least 100 μm, at least 200 μm, at least 300 μm, at least 400 μm, at least 500 μm, at least 600 μm, at least 700 μm, at least 800 μm, at least 900 μm, at most 1000 μm, at most 950 μm, at most 850 μm, at most 750 μm, at most 650 μm, at most 550 μm, at most 450 μm, at most 350 μm, at most 250 μm, at most 150 μm, and at most 75 μm.

A42. The probe of any of paragraphs A1-A41, wherein the fiducial target is formed of a different material than at least one of the probe tip, the probe beam, and the probe body.

A43. The probe of any of paragraphs A1-A42, wherein the fiducial target is formed of at least one of a plastic, an acrylic, a metal, and a glass.

A44. The probe of paragraph A43, wherein the fiducial target is a glass sphere.

A45. The probe of any of paragraphs A1-A44, wherein the fiducial target is nonmetallic.

A46. The probe of any of paragraphs A1-A45, wherein the fiducial target is affixed to the probe beam by an adhesive that optionally includes at least one of an epoxy and a thermal epoxy.

A47. The probe of paragraph A46, wherein the probe includes a first adhesive that substantially covers a/the upper surface of the probe beam, and wherein the fiducial target is affixed to the first adhesive via a second adhesive.

A48. The probe of any of paragraphs A1-A47, wherein the fiducial target is affixed to the probe beam such that the fiducial target is at least partially recessed into the probe beam.

B1. A method of utilizing a probe that includes a fiducial target, the method comprising:
providing the probe of any of paragraphs A1-A48;
determining a first position of the fiducial target relative to the optical system;
translating the DUT relative to the probe; and
determining a second position of the fiducial target relative to the optical system.

B2. The method of paragraph B1, wherein the first position corresponds to a three-dimensional position of the fiducial target relative to the optical system.

B3. The method of any of paragraphs B1-B2, wherein the determining the first position includes scanning a focus of the optical system to focus on a focused light reflection produced by the fiducial target.

B4. The method of paragraph B3, wherein the focused light reflection includes light that is internally reflected within the fiducial target.

B5. The method of any of paragraphs B3-B4, wherein the focused light reflection includes light that is reflected from an external surface of the fiducial target.

B6. The method of any of paragraphs B3-B5, wherein the scanning includes translating a focus plane of the optical system along an optical axis of the optical system while recording a series of images of at least a portion of the probe with the optical system.

B7. The method of any of paragraphs B1-B6, wherein the determining the first position includes determining a first height offset between the optical system and the fiducial target, as measured along a direction parallel to a/the optical axis of the optical system.

B8. The method of paragraph B7, wherein the determining the first height offset includes analyzing the series of images to identify a position of the focal plane at which the focused light reflection is maximally in focus, optionally utilizing an automated focus optimization routine.

B9. The method of paragraph B8, wherein the automated focus optimization routine includes one or more of a pattern score routine and a gradient search routine.

B10. The method of any of paragraphs B1-B9, wherein the determining the first position includes determining a first planar position of the fiducial target, as measured along a direction perpendicular to a/the optical axis of the optical system.

B11. The method of paragraph B10, wherein the determining the first planar position of the fiducial target includes identifying a location within a field of view of the optical system at which the focused light reflection appears when the focused light reflection is maximally in focus.

B12. The method of any of paragraphs B1-B11, wherein the translating the DUT relative to the probe includes translating the DUT to deflect the probe beam with respect to the probe body.

B13. The method of any of paragraphs B1-B12, wherein the translating the DUT relative to the probe includes translating the DUT while the probe is maintained in a substantially stationary position.

B14. The method of any of paragraphs B1-B13, wherein the translating the DUT relative to the probe includes translating the probe while maintaining the DUT in a substantially stationary position.

B15. The method of any of paragraphs B1-B14, wherein the translating the DUT relative to the probe includes translating the DUT and/or the probe toward one another.

B16. The method of any of paragraphs B1-B14, wherein the translating the DUT relative to the probe includes translating the DUT and/or the probe away from one another.

B17. The method of any of paragraphs B1-B16, wherein the second position corresponds to a three-dimensional position of the fiducial target relative to the optical system.

B18. The method of any of paragraphs B1-B17, wherein the determining the second position includes scanning a focus of the optical system to focus on a/the focused light reflection produced by the fiducial target.

B19. The method of paragraph B18, wherein the scanning includes translating a/the focus plane of the optical system along a/the optical axis of the optical system while recording a series of images of at least a portion of the probe with the optical system.

B20. The method of any of paragraphs B1-B19, wherein the determining the second position includes determining a second height offset between the optical system and the fiducial target, as measured along a direction parallel to a/the optical axis of the optical system.

B21. The method of paragraph B20, wherein the determining the second height offset includes analyzing the series of images to identify a position of the focal plane at which the focused light reflection is maximally in focus, optionally utilizing an automated focus optimization routine.

B22. The method of paragraph B21, wherein the automated focus optimization routine includes one or more of a pattern score routine and a gradient search routine.

B23. The method of any of paragraphs B1-B22, wherein the determining the second position includes determining a second planar position of the fiducial target, as measured along a direction perpendicular to a/the optical axis of the optical system.

B24. The method of paragraph B23, wherein the determining the second planar position of the fiducial target includes identifying a location within a field of view of the optical system at which the focused light reflection appears when the focused light reflection is maximally in focus.

B25. The method of any of paragraphs B1-B24, further comprising, prior to the determining the first position, bringing the at least one probe tip into contact with a corresponding DUT.

B26. The method of paragraph B25, wherein the bringing the at least one probe tip into contact with the corresponding DUT includes translating the probe tip with respect to the DUT to bring the probe tip into electrical contact with the DUT.

B27. The method of any of paragraphs B25-B26, wherein the bringing the at least one probe tip into contact with the corresponding DUT includes independently translating one or both of the probe and the DUT in a direction that is at least substantially perpendicular to a contacting surface of the DUT.

B28. The method of any of paragraphs B25-B27, wherein the bringing the at least one probe tip into contact with the corresponding DUT includes scrubbing the at least one probe tip across at least a portion of a/the contacting surface of the DUT.

B29. The method of any of paragraphs B25-B28, wherein the bringing the at least one probe tip into contact with the corresponding DUT includes translating one or both of the probe and the DUT manually.

B30. The method of any of paragraphs B25-B29, wherein the bringing the at least one probe tip into contact with the corresponding DUT includes translating one or both of the probe and the DUT at least partially autonomously.

B31. The method of any of paragraphs B1-B30, further comprising, subsequent to the determining the second position, determining an overdrive distance of the probe relative to the DUT, wherein the determining is based, at least in part, on one or more of the first position, the second position, and a difference between the first position and the second position.

B32. The method of paragraph B31, wherein the overdrive distance is equal to a difference between a/the first height offset and a/the second height offset.

C1. A probe system configured to test at least one device under test (DUT), the probe system comprising:
  at least one probe of any of paragraphs A1-A48 configured to test a corresponding DUT of the at least one DUT; and
  an optical system configured to collect an image of at least a portion of at least one probe along an optical axis as the probe approaches the corresponding DUT;
  wherein the probe system is configured to enable a determination of a position of at least one fiducial target of the at least one probe.

C2. The probe system of paragraph C1, further comprising one or more of:
  at least one probe holder configured to support and maintain a corresponding probe of the at least one probe relative to the corresponding DUT of the at least one DUT;
  a chuck that defines a support surface configured to support a substrate that includes the at least one DUT; and
  a controller programmed to execute the method of any of paragraphs B1-B31.

C3. The probe system of paragraph C2, wherein the probe system includes the controller, and wherein the controller is configured to execute an/the automated focus optimization routine to determine a position of the fiducial target relative to the optical system.

C4. The probe system of any of paragraphs C1-C3, wherein the optical system includes one or more of:
  an illumination light source configured to illuminate at least one fiducial target of the at least one probe;
  a microscope, optionally a visible light microscope and/or a confocal microscope, configured to collect light that is reflected from the at least one fiducial target to form a corresponding focused light reflection; and
  an optical enclosure configured to restrict ambient light from entering at least a portion of the optical system.

C5. The probe system of any of paragraphs C1-C4, wherein the probe system is configured such that a location of a focal plane of the optical system along an optical axis of the optical system may be recorded synchronously with an image of a portion of the probe system that is visible to the optical system.

C6. The probe system of any of paragraphs C1-C5, wherein the optical system has a field of view, and wherein the probe system is configured such that at least one fiducial target and at least one probe tip each are within the field of view when the at least one probe tip approaches the DUT.

C7. The probe system of any of paragraphs C1-C6, wherein a/the field of view of the optical system has a field of view linear dimension, as measured along a direction at least substantially perpendicular to the optical axis of the optical system, that is one or more of at least 100 micrometers ($\mu m$), at least 300 $\mu m$, at least 500 $\mu m$, at least 1 millimeter (mm), at least 1.5 mm, at least 2 mm, at least 3 mm, at least 5 mm, at most 7 mm, at most 2.5 mm, at most 1.7 mm, at most 1.2 mm, at most 700 $\mu m$, at most 200 $\mu m$, at least 100 pixels, at least 300 pixels, at least 500 pixels, at least 1000 pixels, at least 1300 pixels, at least 1500 pixels, at least 2000 pixels, at least 2500 pixels, at most 3000 pixels, at most 2200 pixels, at most 1700 pixels, at most 1200 pixels, at most 700 pixels, and at most 200 pixels.

C8. The probe system of any of paragraphs C1-C7, wherein one or more probes of the at least one probe includes a plurality of corresponding fiducial targets.

C9. The probe system of paragraph C8, wherein at least one fiducial target of the plurality of corresponding fiducial targets is distinct from at least one other fiducial target of the plurality of corresponding fiducial targets.

C10. The probe system of any of paragraphs C1-C9, wherein the probe system includes a plurality of probes, and wherein each probe includes a corresponding fiducial target that is configured to enable unique identification of the probe.

D1. A method of manufacturing a probe with a fiducial target, the method comprising:
  providing a probe that has a probe beam and at least one probe tip; and
  affixing a fiducial target to the probe beam.

D2. The method of paragraph D1, wherein the affixing includes affixing the fiducial target to an upper surface of the probe beam.

D3. The method of any of paragraphs D1-D2, wherein the affixing includes affixing the fiducial target to the probe beam such that the fiducial target is visible to an optical system when the probe approaches a device under test (DUT).

D4. The method of any of paragraphs D1-D3, wherein the affixing includes adhering the fiducial target to the probe beam with an adhesive that optionally includes at least one of an epoxy and a thermal epoxy.

D5. The method of any of paragraphs D1-D4, wherein the affixing includes positioning the fiducial target at a predetermined orientation with respect to the probe beam.

D6. The method of any of paragraphs D1-D5, wherein the fiducial target is at least substantially spherical.

D7. The method of any of paragraphs D1-D6, wherein the probe is the probe of any of paragraphs A1-A48.

INDUSTRIAL APPLICABILITY

The probes, probe systems, and methods disclosed herein are applicable to the semiconductor test industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions, and/or properties disclosed herein. Similarly, when the disclosure, the preceding numbered paragraphs, or subsequently filed claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements, and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe for a probe system, the probe comprising:
    a probe body;
    a probe beam extending from the probe body;
    at least one probe tip extending from a leading edge of the probe beam distal to the probe body and configured to contact a device under test (DUT); and
    at least one fiducial target affixed to the probe beam;
    wherein:
    (i) an illumination light source is configured to emit emitted light to illuminate the fiducial target;
    (ii) the fiducial target is configured to be visible to an optical system when the probe tip approaches the DUT to facilitate determining a position of the at least one probe tip relative to the DUT;
    (iii) the fiducial target is configured to produce a focused light reflection of the emitted light;
    (iv) the optical system is configured to receive the focused light reflection from the fiducial target;
    (v) the optical system is configured to receive a fiducial image of at least a portion of the fiducial target when the probe tip approaches the DUT and when the fiducial target is in focus to the optical system;
    (vi) the fiducial image has a fiducial image diameter; and
    (vii) the focused light reflection has a focused light reflection diameter that is at most 25% of the fiducial image diameter.

2. The probe of claim 1, wherein the focused light reflection includes light that is reflected from an exterior surface of the fiducial target.

3. The probe of claim 1, wherein the focused light reflection includes light that undergoes internal reflection within the fiducial target.

4. The probe of claim 1, wherein the fiducial target is configured to be in focus to the optical system within a discrete focal resolution range of the optical system that is smaller than a focal resolution range over which the probe beam is in focus to the optical system.

5. The probe of claim 1, wherein the fiducial target is affixed to an upper surface of the probe beam.

6. The probe of claim 1, wherein the fiducial target includes at least one axis of symmetry.

7. The probe of claim 6, wherein the fiducial target is at least substantially spherical.

8. The probe of claim 1, wherein the fiducial target is optically reflective.

9. The probe of claim 1, wherein the fiducial target is at least partially optically transparent.

10. The probe of claim 1, wherein the fiducial target has a fiducial target diameter that is at most 150 micrometers (μm).

11. The probe of claim 1, wherein the fiducial target is formed of a different material than the probe beam.

12. The probe of claim 1, wherein the fiducial target is a glass sphere.

13. The probe of claim 1, wherein the fiducial target is affixed to the probe beam with an adhesive that includes an epoxy.

14. The probe of claim 1, wherein the probe beam is configured to resiliently deform to transition between a nominal position with respect to the probe body and a deflected position with respect to the probe body.

15. A method of utilizing a probe that includes a fiducial target, the method comprising:
    providing the probe of claim 1;
    determining a first position of the fiducial target relative to the optical system;
    translating the DUT relative to the probe; and
    determining a second position of the fiducial target relative to the optical system.

16. The method of claim 15, wherein one or both of the first position and the second position corresponds to a three-dimensional position of the fiducial target relative to the optical system.

17. The method of claim 15, wherein one or both of the determining the first position and the determining the second position includes scanning a focus of the optical system to focus on the focused light reflection produced by the fiducial target.

18. The method of claim 17, wherein the scanning the focus includes translating a focus plane of the optical system along an optical axis of the optical system while recording a series of images of at least a portion of the probe with the optical system.

19. The method of claim 15, wherein the translating the DUT relative to the probe includes translating the DUT while the probe is maintained in a substantially stationary position.

20. The method of claim 15, further comprising, prior to the determining the first position, bringing the at least one probe tip into contact with a corresponding DUT.

21. The method of claim 15, wherein the determining the first position includes determining a first height offset between the optical system and the fiducial target, as measured along a direction parallel to an optical axis of the optical system, wherein the determining the second position includes determining a second height offset between the optical system and the fiducial target, as measured along the direction parallel to the optical axis, and wherein the method further includes, subsequent to the determining the second position, determining an overdrive distance of the probe relative to the DUT, wherein the overdrive distance is equal to a difference between the first height offset and the second height offset.

22. A probe system configured to test at least one device under test (DUT), the probe system comprising:
    at least one probe of claim 1 configured to test a corresponding DUT of the at least one DUT; and
    an optical system configured to collect an image of at least a portion of at least one probe along an optical axis as the probe approaches the corresponding DUT;
    wherein the probe system is configured to enable a determination of a position of at least one fiducial target of the at least one probe.

23. The probe system of claim 22, wherein the probe system is configured such that a location of a focal plane of the optical system along an optical axis of the optical system may be recorded synchronously with an image of a portion of the probe system that is visible to the optical system.

24. The probe system of claim 22, wherein the optical system has a field of view, and wherein the probe system is configured such that at least one fiducial target and at least one probe tip each are within the field of view when the at least one probe tip approaches the DUT.

25. The probe system of claim 22, wherein the optical system has a field of view, wherein the field of view has a field of view linear dimension, as measured along a direction at least substantially perpendicular to the optical axis, wherein the fiducial target is configured to produce the focused light reflection with the focused light reflection diameter, and wherein the focused light reflection diameter is at least 0.1% of the field of view linear dimension and at most 10% of the field of view linear dimension.

26. A method of manufacturing the probe of claim 1, the method comprising:
providing the probe beam; and
affixing the fiducial target to the probe beam.

27. The method of claim 26, wherein the affixing the fiducial target includes adhering the fiducial target to the probe beam with an adhesive.

28. The probe of claim 1, wherein the fiducial target is configured to be more optically resolvable by the optical system relative to at least a portion of the probe beam that is adjacent to the fiducial target.

29. A probe for a probe system, the probe comprising:
a probe body;
a probe beam extending from the probe body;
at least one probe tip extending from a leading edge of the probe beam distal to the probe body and configured to contact a device under test (DUT); and
at least one fiducial target affixed to the probe beam; wherein:
(i) an illumination light source is configured to emit emitted light to illuminate the fiducial target;
(ii) the fiducial target is configured to be visible to an optical system when the probe tip approaches the DUT to facilitate determining a position of the at least one probe tip relative to the DUT;
(iii) the fiducial target is configured to produce a focused light reflection of the emitted light; and
(iv) the focused light reflection has a focused light reflection diameter that is less than an incident light diameter of the emitted light that is incident upon the fiducial target.

30. A method of utilizing a probe that includes a fiducial target, the method comprising:
providing the probe that includes:
(i) a probe body;
(ii) a probe beam extending from the probe body;
(iii) at least one probe tip extending from a leading edge of the probe beam distal to the probe body and configured to contact a device under test (DUT); and
(iv) at least one fiducial target affixed to the probe beam, wherein the fiducial target is configured to be visible to an optical system when the probe tip approaches the DUT to facilitate determining a position of the at least one probe tip relative to the DUT; and wherein the fiducial target is configured to be more optically resolvable by the optical system relative to at least a portion of the probe beam that is adjacent to the fiducial target;
determining a first position of the fiducial target relative to the optical system, wherein the determining the first position includes determining a first height offset between the optical system and the fiducial target, as measured along a direction parallel to an optical axis of the optical system;
translating the DUT relative to the probe;
determining a second position of the fiducial target relative to the optical system, wherein the determining the second position includes determining a second height offset between the optical system and the fiducial target, as measured along the direction parallel to the optical axis; and
subsequent to the determining the second position, determining an overdrive distance of the probe relative to the DUT, wherein the overdrive distance is equal to a difference between the first height offset and the second height offset.

* * * * *